United States Patent
Ho et al.

(10) Patent No.: US 11,581,854 B2
(45) Date of Patent: Feb. 14, 2023

(54) ENVELOPE TRACKING SUPPLY MODULATOR TOPOLOGY FOR WIPE-BANDWIDTH RADIO FREQUENCY TRANSMITTER

(71) Applicant: MEDIATEK INC., Hsin-Chu (TW)

(72) Inventors: Chen-Yen Ho, Hsin-Chu (TW);
Chien-Wei Kuan, Hsin-Chu (TW);
Sheng-Hong Yan, Hsin-Chu (TW);
Hsin-Hung Chen, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 142 days.

(21) Appl. No.: 16/379,720

(22) Filed: Apr. 9, 2019

(65) Prior Publication Data
US 2019/0334479 A1    Oct. 31, 2019

Related U.S. Application Data

(60) Provisional application No. 62/662,969, filed on Apr. 26, 2018.

(51) Int. Cl.
*H03F 1/02* (2006.01)
*H04B 1/04* (2006.01)
(Continued)

(52) U.S. Cl.
CPC .......... *H03F 1/0222* (2013.01); *H03F 3/245* (2013.01); *H03F 3/68* (2013.01); *H04B 1/04* (2013.01); *H03F 2200/102* (2013.01); *H03F 2200/451* (2013.01); *H03F 2200/48* (2013.01); *H04B 2001/0408* (2013.01)

(58) Field of Classification Search
CPC ........ H03F 1/02; H03F 1/0211; H03F 1/0277; H03F 3/20; H03F 3/211; H03F 3/213; H03F 3/34; H03F 1/0222; H03F 3/245; H03F 3/68; H03F 2200/102; H03F 2200/451;
(Continued)

(56) References Cited

U.S. PATENT DOCUMENTS 9,467,095 B2 * 10/2016 Langer .................. H04B 1/006
9,490,881 B2    11/2016 Wimpenny
(Continued)

FOREIGN PATENT DOCUMENTS

CN    106549564 A    3/2017
EP    2 980 988 A1    2/2016
(Continued)

OTHER PUBLICATIONS

Masunaga et al., A low noise and low loss power MOSFET with low Vth regions for voltage regulators. IEEE 2013 25th International Symposium on Power Semiconductor Devices & IC's (ISPSD) May 26, 2013:91-4.

*Primary Examiner* — Blane J Jackson
(74) *Attorney, Agent, or Firm* — Wolf, Greenfield & Sacks, P.C.

(57) ABSTRACT

A package or a chip including a linear amplifier and a power amplifier is provided, wherein the linear amplifier is configured to receive an envelope tracking signal to generate an amplified envelope tracking signal, the power amplifier is supplied by an envelope tracking supply voltage comprising a DC supply voltage and the amplified envelope tracking signal, and the power amplifier is configured to receive an input signal to generate an output signal.

12 Claims, 6 Drawing Sheets

(51) Int. Cl.
*H03F 3/21* (2006.01)
*H03F 3/24* (2006.01)
*H03F 3/68* (2006.01)

(58) Field of Classification Search
CPC .............. H04B 1/04; H04B 2001/0408; H04B 2001/045
See application file for complete search history.

(56) References Cited

U.S. PATENT DOCUMENTS

| | | | | |
|---|---|---|---|---|
| 10,122,323 | B2* | 11/2018 | Khlat | H03F 1/0227 |
| 10,270,394 | B2* | 4/2019 | Drogi | H03F 1/0227 |
| 2012/0154035 | A1* | 6/2012 | Hongo | H03F 1/0244 |
| | | | | 330/127 |
| 2013/0043953 | A1* | 2/2013 | Spiegel | H03F 1/0227 |
| | | | | 330/297 |
| 2013/0093511 | A1* | 4/2013 | Baek | H03F 3/602 |
| | | | | 330/124 R |
| 2013/0135043 | A1* | 5/2013 | Hietala | H03F 1/0277 |
| | | | | 330/124 R |
| 2013/0217345 | A1 | 8/2013 | Balteanu | |
| 2013/0231069 | A1* | 9/2013 | Drogi | H04B 1/0475 |
| | | | | 455/114.3 |
| 2014/0266428 | A1* | 9/2014 | Chiron | H03F 1/02 |
| | | | | 330/127 |
| 2015/0194933 | A1 | 7/2015 | Wilson | |
| 2017/0033747 | A1* | 2/2017 | Balteanu | H03F 1/0266 |
| 2017/0338773 | A1* | 11/2017 | Balteanu | H03F 1/0277 |
| 2018/0048272 | A1 | 2/2018 | Lin | |
| 2018/0138862 | A1* | 5/2018 | Balteanu | H03F 1/0227 |
| 2018/0159476 | A1 | 6/2018 | Balteanu | |

FOREIGN PATENT DOCUMENTS

| | | |
|---|---|---|
| EP | 3 185 414 A1 | 6/2017 |
| JP | 2012-4882 A | 1/2012 |
| TW | 201214951 A | 4/2012 |
| TW | 201720052 A | 6/2017 |
| TW | I617132 B | 3/2018 |
| WO | 2012/081588 A1 | 6/2012 |

* cited by examiner

ENVELOPE TRACKING SUPPLY MODULATOR TOPOLOGY FOR WIPE-BANDWIDTH RADIO FREQUENCY TRANSMITTER

CROSS REFERENCE TO RELATED APPLICATIONS

This application claims the priority of U.S. Provisional Application No. 62/662,969, filed on Apr. 26, 2018, which is included herein by reference in its entirety.

BACKGROUND

In a conventional envelope tracking supply modulator (ETSM) architecture, a power management integrated circuit (PMIC) provides an envelope tracking supply voltage to a power amplifier within another chip. In addition, for a wide-bandwidth application such that the envelope tracking bandwidth is higher than 100 MHz, the ETSM requires high linearity, however, the parasitic inductance of a trace of a printer circuit board (PCB) and a capacitor load of the power amplifier induce inductive peaking at the envelope tracking supply voltage, and the inductive peaking degrades the performance and the efficiency of the ETSM. Therefore, how to provide a new ETSM architecture that can improve the performance of the ETSM is an important topic.

SUMMARY

It is therefore an objective of the present invention to provide an ETSM topology that can reduce the parasitic inductance of the PCB and increase the linearity and performance of the ETSM, to solve the above-mentioned problems.

According to one embodiment of the present invention, a package comprises a linear amplifier and a power amplifier is provided, wherein the linear amplifier is configured to receive an envelope tracking signal to generate an amplified envelope tracking signal, and the power amplifier is supplied by an envelope tracking supply voltage comprising a DC supply voltage and the amplified envelope tracking signal, and the power amplifier is configured to receive an input signal to generate an output signal.

According to another embodiment of the present invention, a package comprising a first linear amplifier, a second linear amplifier, a first power amplifier and a second power amplifier is disclosed. In the chip, the first linear amplifier is configured to receive a first envelope tracking signal to generate an amplified first envelope tracking signal. The second linear amplifier is configured to receive a second envelope tracking signal to generate an amplified second envelope tracking signal. The first power amplifier is supplied by a first envelope tracking supply voltage comprising a first DC supply voltage and the amplified first envelope tracking signal, and is configured to receive a first input signal to generate a first output signal. The second power amplifier is supplied by a second envelope tracking supply voltage comprising a second DC supply voltage and the amplified second envelope tracking signal, and is configured to receive a second input signal to generate a second output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
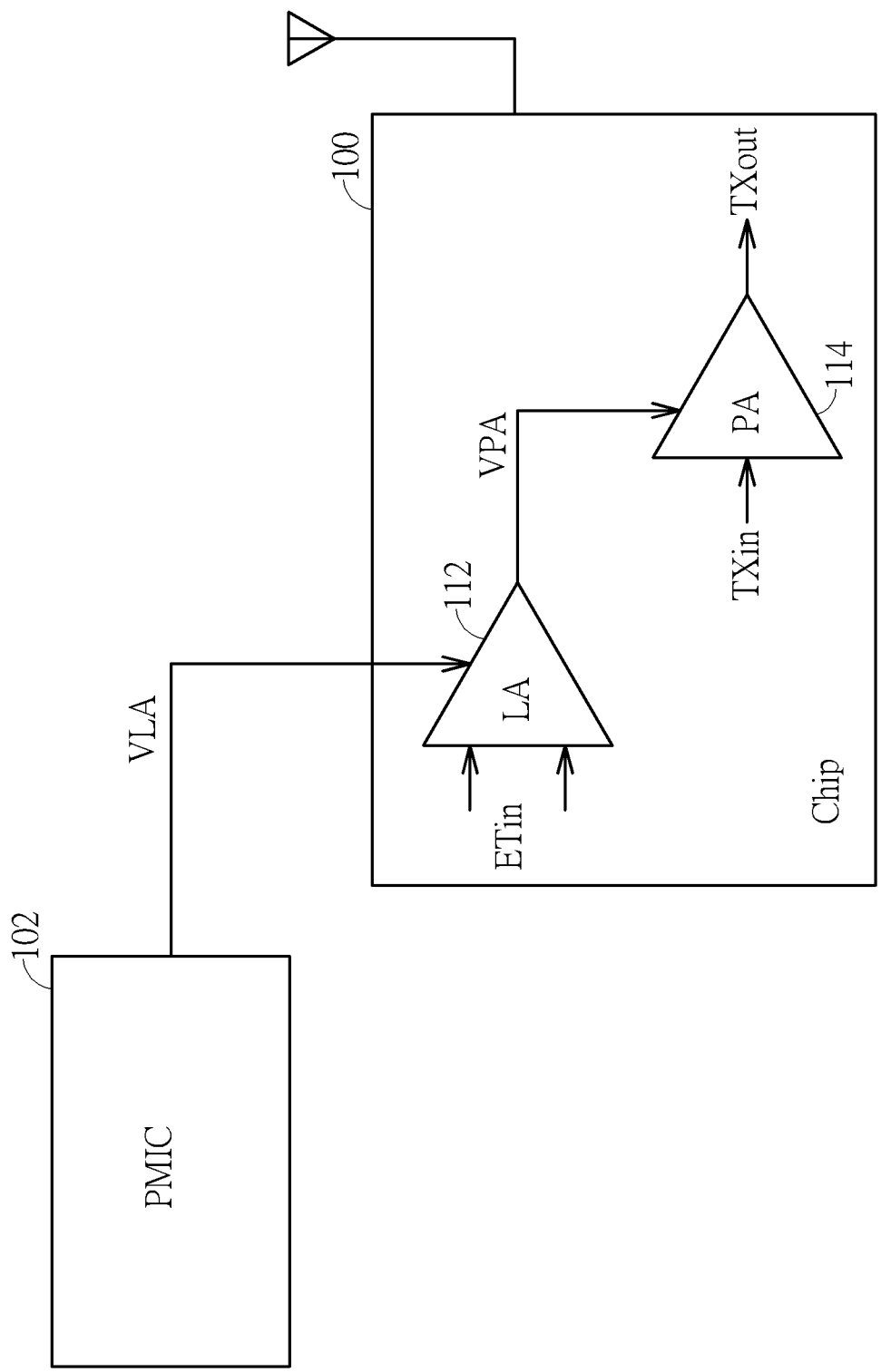
FIG. 1 is a diagram illustrating a package, a chip, a die, a substrate or an integrated circuit according to one embodiment of the present invention.

FIG. 1 is a diagram illustrating a package, a chip, a die, a substrate or an integrated circuit according to one embodiment of the present invention. In the following description, the symbol 100 is used to represent a chip, however, the symbol 100 may be used to indicate a package, a die, a substrate (e.g. silicon substrate) or an integrated circuit in other embodiments. As shown in FIG. 1, the chip 100 comprises a linear amplifier 112, and a power amplifier 114. In this embodiment, the chip 100 is coupled to a PMIC 102, and the linear amplifier 112 and the power amplifier 114 serve as part of a transmitter for transmitting RF signal via at least one antenna.

The embodiment shown in FIG. 1 provides the ETSM topology comprising the PMIC 102 and the linear amplifier 112 within the chip 100, and the PMIC 102 and the linear amplifier 112 are configured to generate an envelope tracking supply voltage VPA to the power amplifier 114, and the power amplifier 114 uses the envelope tracking supply voltage VPA as a supply voltage to amplify an input signal TXin to generate an output signal TXout.

Figure 2:
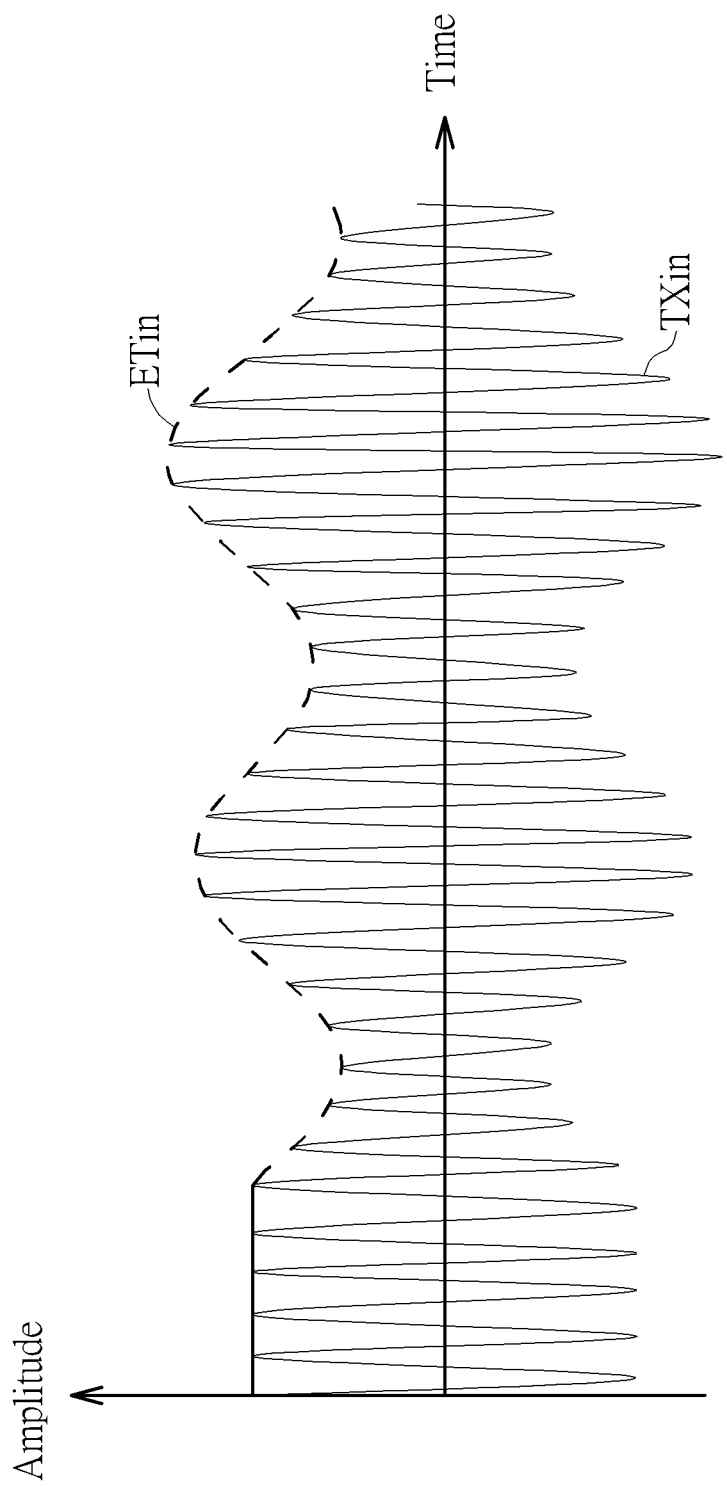
FIG. 2 shows the input signal and the envelope tracking signal according to one embodiment of the present invention.

Specifically, the PMIC 102 is configured to generate a DC supply voltage VLA to the chip 100, and the linear amplifier 112 receives an envelope tracking signal ETin to generate the envelope tracking supply voltage VPA based on the DC supply voltage VLA. Then, the power amplifier 114 uses the envelope tracking supply voltage VPA to amplify the input signal TXin to generate the output signal TXout. In this embodiment, the envelope tracking signal ETin may be provided by a baseband circuit external to the chip 100. FIG. 2 shows the input signal TXin and the envelope tracking signal ETin according to one embodiment of the present invention, where the input signal TXin is an RF signal, and the envelope tracking signal ETin is at least partially follows an envelope of the input signal TXin.

In the embodiment shown in FIG. 1, because the linear amplifier 112 and the power amplifier 114 are within the same chip 100, and the envelope tracking supply voltage VPA is generated within the chip 100, the envelope tracking supply voltage VPA will not suffer the inductive peaking induced by the parasitic inductance of the PCB. Therefore, the performance and efficiency of the power amplifier 114 will be better.

Figure 3:
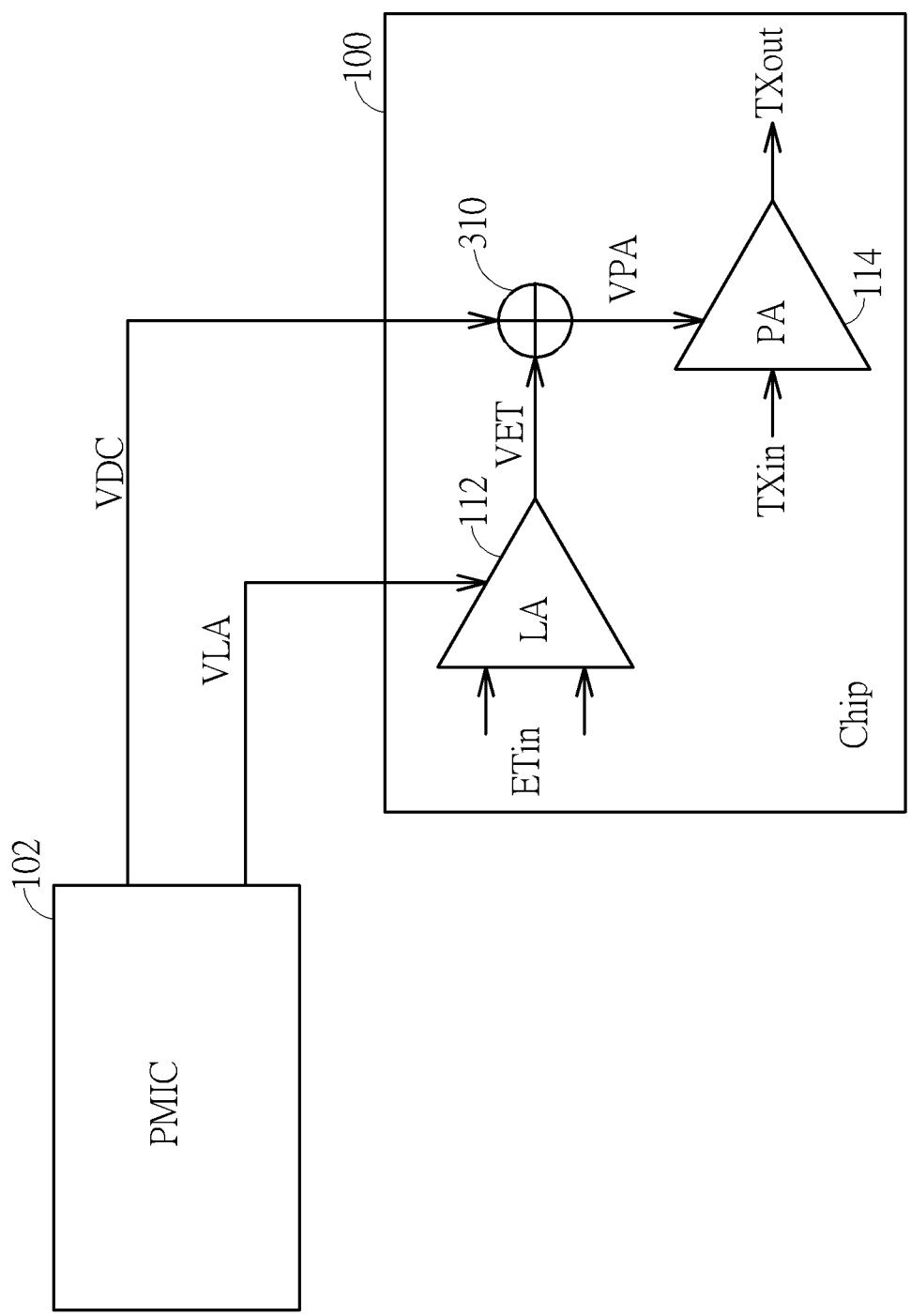
FIG. 3 shows the DC-coupled ETSM according to one embodiment of the present invention.
Figure 4:
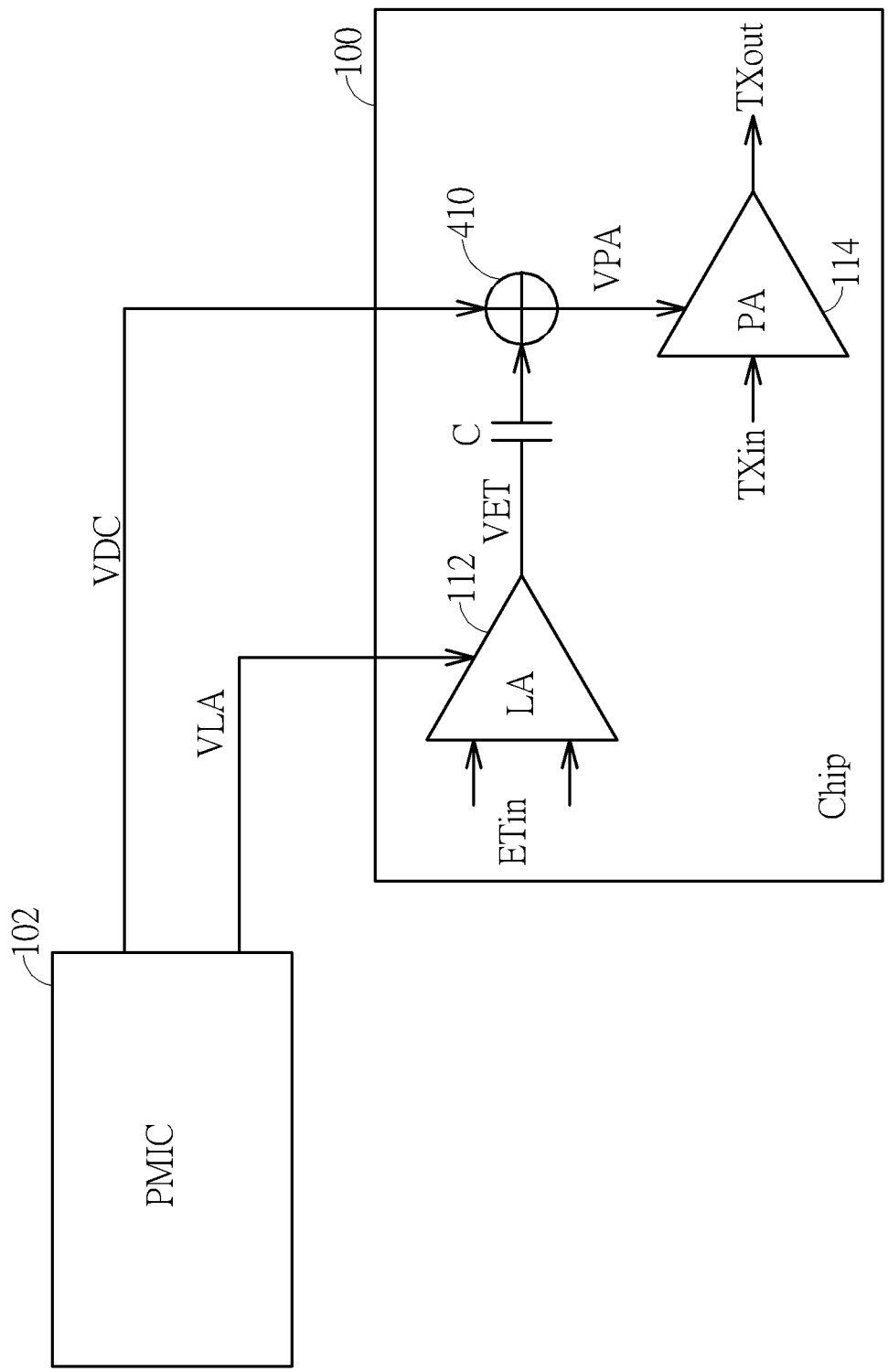
FIG. 4 shows the AC-coupled ETSM according to one embodiment of the present invention.

The ETSM topology shown in FIG. 1 may be DC-coupled mode or AC-coupled mode. FIG. 3 shows the DC-coupled ETSM according to one embodiment of the present invention. As shown in FIG. 3, the chip 100 further comprises a supply voltage generator 310, and the linear amplifier 112 receives the envelope tracking signal ETin to generate an amplifier envelope tracking signal VET, and the supply voltage generator 310 combines a DC supply voltage VDC generated by the PMIC 102 with the amplifier envelope tracking signal VET to generate the envelope tracking supply voltage VPA to the power amplifier 114. FIG. 4 shows the AC-coupled ETSM according to one embodiment of the present invention. As shown in FIG. 4, the chip 100 further comprises a supply voltage generator 410 and a capacitor C, and the linear amplifier 112 receives the envelope tracking signal ETin to generate an amplifier envelope tracking signal VET. The supply voltage generator 410 receives the amplifier envelope tracking signal VET via the capacitor C (i.e. receives AC components of the amplifier envelope tracking signal VET), and the supply voltage generator 410 combines the DC supply voltage VDC with the amplifier envelope tracking signal VET (AC components) to generate the envelope tracking supply voltage VPA to the power amplifier 114.

Figure 5:
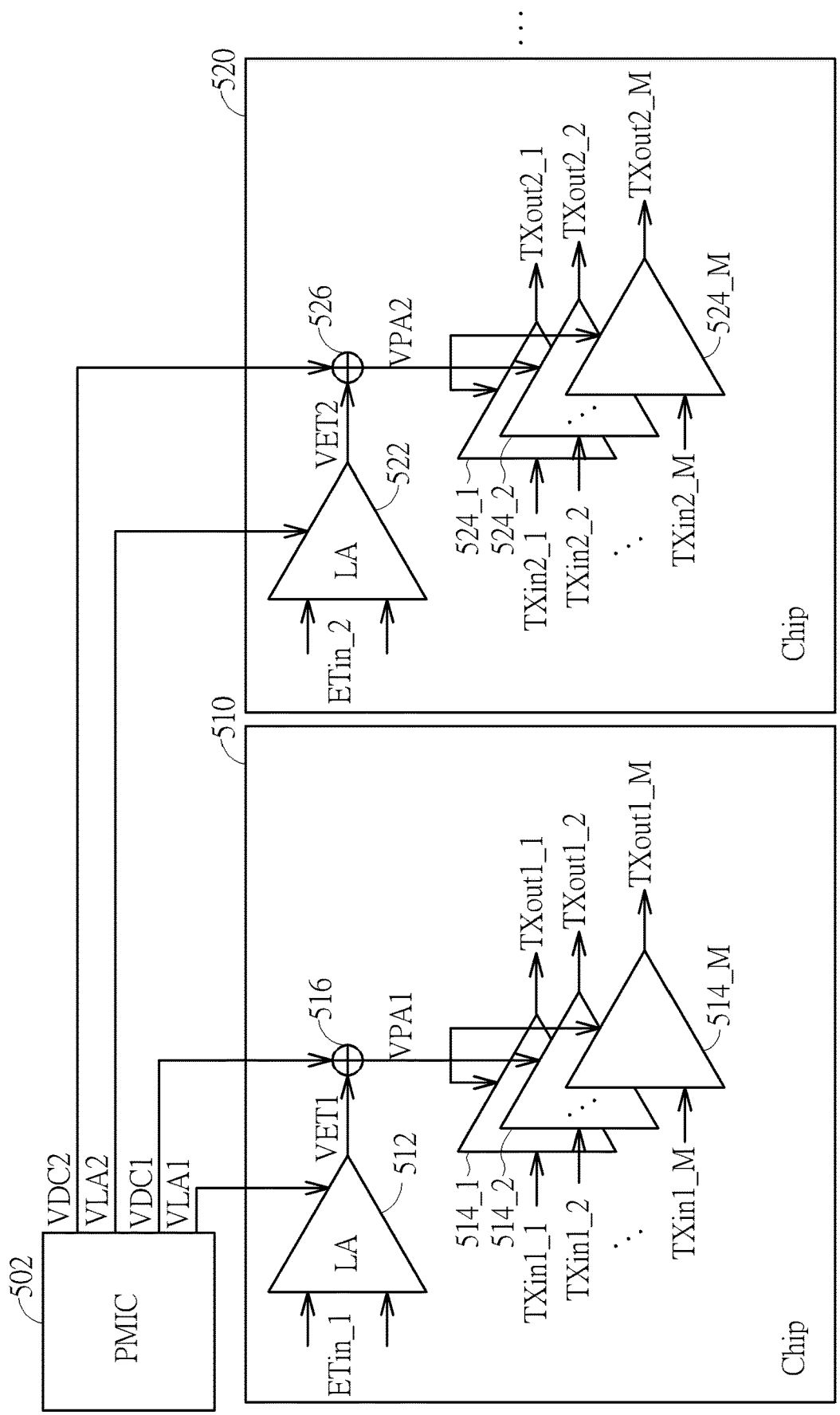
FIG. 5 is a diagram illustrating two chips, two modules, two dies, two substrates, two integrated circuits or two packages according to one embodiment of the present invention.

FIG. 5 is a diagram illustrating at least two chips, two modules, two dies, two substrates, two integrated circuits or two packages according to another embodiment of the present invention. In the following description, each of the symbols 510 and 520 is used to represent a chip, however, the symbol 510 or 520 may be used to indicate a package, a chip, a die, a substrate or an integrated circuit, or the symbols 510 and 520 may be modules positioned within a chip or a package together in other embodiments. As shown in FIG. 5, the chip 510 comprises a linear amplifier 512, at least one power amplifier such as a plurality of power amplifiers 514_1-514_M and a supply voltage generator 516. The chip 520 comprises a linear amplifier 522, at least one power amplifier such as a plurality of power amplifiers 524_1-524_M and a supply voltage generator 526. In this embodiment, the circuit shown in FIG. 5 supports multi-input multi-output (MIMO) beamforming technology, the chips 510 and 520 are coupled to a PMIC 502, and the linear amplifiers 512 and 522, the power amplifiers 514_1-514_M and 524_1-524_M, and the supply voltage generator 516 and 526 serve as part of a transmitter for transmitting RF signals via at least one antenna.

The embodiment shown in FIG. 5 provides the ETSM topology comprising the PMIC 502 and the linear amplifiers 512 and 522 respectively within the chips 510 and 520. The PMIC 502 is configured to generate at least DC supply voltages VLA1 and VLA2 to the chips 510 and 520, respectively. The linear amplifiers 512 and 522 use the DC supply voltages VLA1 and VLA2 as the supply voltage, and generate envelope tracking supply voltages VPA1 and VPA2 based on the envelope tracking signals ETin_1 and ETin_2, respectively. In this embodiment, the linear amplifier 512 receives the envelope tracking signal ETin_1 to generate an amplifier envelope tracking signal VET1, and the supply voltage generator 516 combines a DC supply voltage VDC1 generated by the PMIC 502 with the amplifier envelope tracking signal VET1 to generate the envelope tracking supply voltage VPA1; and the linear amplifier 522 receives the envelope tracking signal ETin_2 to generate an amplifier envelope tracking signal VET2, and the supply voltage generator 526 combines a DC supply voltage VDC2 generated by the PMIC 502 with the amplifier envelope tracking signal VET2 to generate the envelope tracking supply voltage VPA2. Then, the power amplifiers 514_1-514_M use the envelope tracking supply voltage VPA1 as a supply voltage to amplify input signals TXin1_1-TXin1_M to generate output signals TXout1_1-TXout1_M, respectively, and the power amplifiers 524_1-524_M use the envelope tracking supply voltage VPA2 as a supply voltage to amplify input signals TXin2_1-TXin2_M to generate output signals TXout2_1-TXout2_M, respectively. In this embodiment, M can be any suitable positive integer. In addition, the envelope tracking signals ETin1 and ETin2 may be provided by a baseband circuit external to the chips 510 and 520.

In the embodiment shown in FIG. 5, because the linear amplifier 512 and the power amplifiers 514_1-514_M are within the same chip 510, and the linear amplifier 522 and the power amplifiers 524_1-524_M are within the same chip 520, and the envelope tracking supply voltages VPA1 and VPA2 are generated within the chips 510 and 520, respectively, the envelope tracking supply voltages VPA1 and VPA2 will not suffer the inductive peaking induced by the parasitic inductance of the PCB and the capacitor load of the power amplifier. Therefore, the performance and efficiency of the power amplifier 514_1-514_M and 524_1-524_M will be better.

Figure 6:
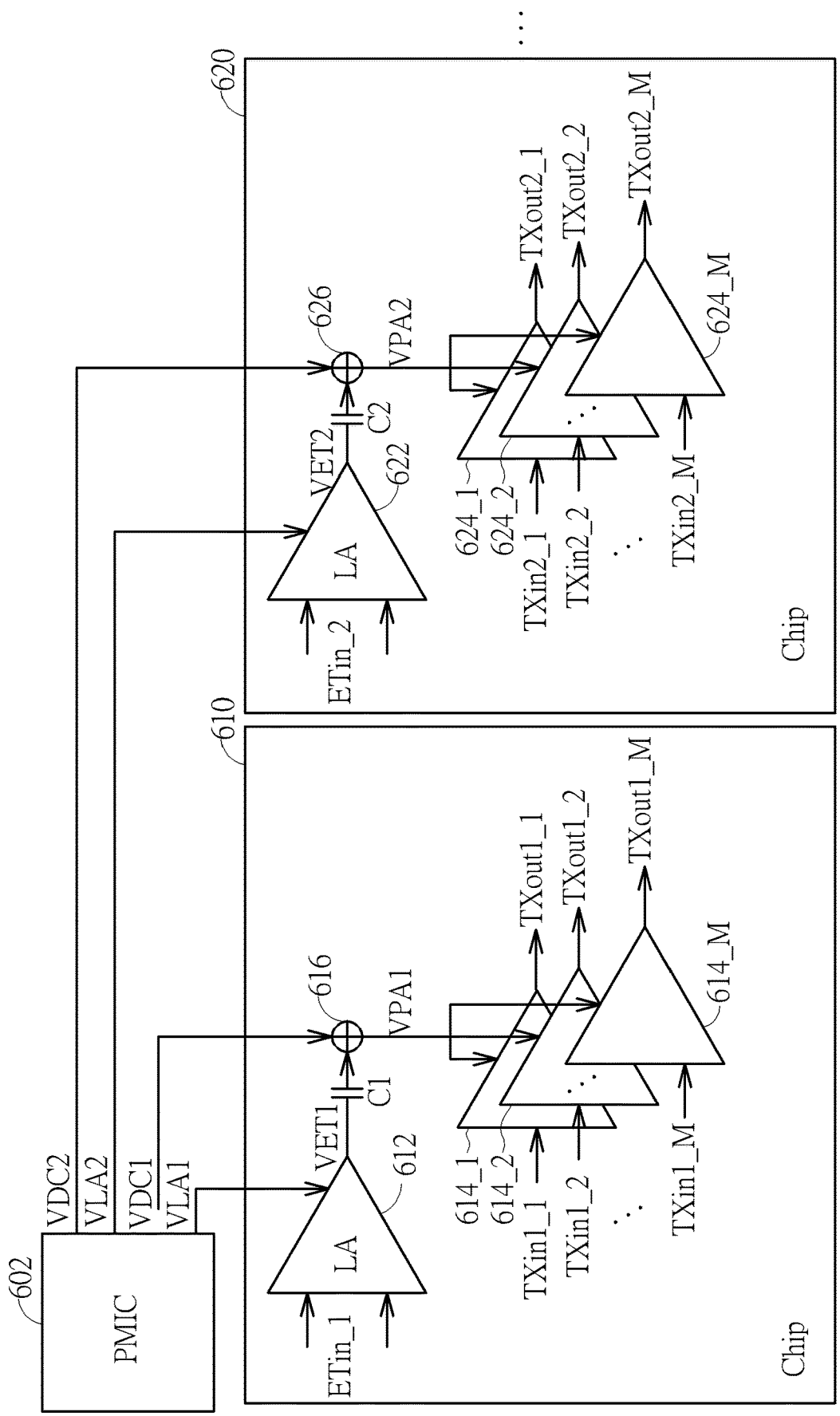
FIG. 6 is a diagram illustrating two chips, two modules, two dies, two substrates, two integrated circuits or two packages according to another embodiment of the present invention.

FIG. 6 is a diagram illustrating at least two chips, two modules, two dies, two substrates, two integrated circuits or two packages according to another embodiment of the present invention. In the following description, each of the symbols 610 and 620 is used to represent a chip, however, each of the symbol 610 or 620 may be used to indicate a package, a chip, a die, a substrate or an integrated circuit, or the symbols 610 and 620 may be modules positioned within a chip or a package in other embodiments. As shown in FIG. 6, the chip 610 comprises a linear amplifier 612, at least one power amplifier such as a plurality of power amplifiers 614_1-614_M, two capacitors C1 and C2, and a supply voltage generator 616. The chip 620 comprises a linear amplifier 622, at least one power amplifier such as a plurality of power amplifiers 624_1-624_M and a supply voltage generator 626. In this embodiment, the circuit shown in FIG. 6 supports MIMO beamforming technology, the chips 610 and 620 are coupled to a PMIC 602, and the linear amplifiers 612 and 622, the power amplifiers 614_1-614_M and 624_1-624_M, and the supply voltage generator 616 and 626 serve as part of a transmitter for transmitting RF signals via at least one antenna.

The embodiment shown in FIG. 6 provides the ETSM topology comprising the PMIC 602 and the linear amplifiers 612 and 622 respectively within the chips 610 and 620. The PMIC 602 is configured to generate at least DC supply voltages VLA1 and VLA2 to the chips 610 and 620, respectively. The linear amplifiers 612 and 622 use the DC supply voltages VLA1 and VLA2 as the supply voltage, and generate envelope tracking supply voltages VPA1 and VPA2 based on the envelope tracking signals ETin_1 and ETin_2, respectively. In this embodiment, the linear amplifier 612 receives the envelope tracking signal ETin_1 to generate an amplifier envelope tracking signal VET1, and the supply voltage generator 616 combines a DC supply voltage VDC1 generated by the PMIC 602 with the amplifier envelope tracking signal VET1 (AC components) to generate the envelope tracking supply voltage VPA1; and the linear amplifier 622 receives the envelope tracking signal ETin_2 to generate an amplifier envelope tracking signal VET2, and the supply voltage generator 626 combines a DC supply voltage VDC2 generated by the PMIC 602 with the amplifier envelope tracking signal VET2 (AC components) to generate the envelope tracking supply voltage VPA2. Then, the power amplifiers 614_1-614_M use the envelope tracking supply voltage VPA1 as a supply voltage to amplify input signals TXin1_1-TXin1_M to generate output signals TXout1_1-TXout1_M, respectively, and the power amplifiers 624_1-624_M use the envelope tracking supply voltage VPA2 as a supply voltage to amplify input signals TXin2_1-TXin2_M to generate output signals TXout2_1-TXout2_M, respectively. In this embodiment, M can be any suitable positive integer. In addition, the envelope tracking signals ETin1 and ETin2 may be provided by a baseband circuit external to the chips 610 and 620.

In the embodiment shown in FIG. 6, because the linear amplifier 612 and the power amplifiers 614_1-614_M are within the same chip 610, and the linear amplifier 622 and the power amplifiers 624_1-624_M are within the same chip 620, and the envelope tracking supply voltages VPA1 and VPA2 are generated within the chips 610 and 620, respectively, the envelope tracking supply voltages VPA1 and VPA2 will not suffer the inductive peaking induced by the parasitic inductance of the PCB and the capacitor load of the power amplifier. Therefore, the performance and efficiency of the power amplifier 614_1-614_M and 624_1-624_M will be better.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package, comprising:
   a linear amplifier, for receiving an envelope tracking signal to generate an amplified envelope tracking signal; and
   a power amplifier, supplied by an envelope tracking supply voltage comprising a combination of a DC supply voltage and the amplified envelope tracking signal, for receiving an input signal to generate an output signal,
   wherein the linear amplifier and the power amplifier are within the package, and the DC supply voltage is provided by a power management integrated circuit external to the package,
   wherein the linear amplifier and the power amplifier are within one die.

2. The package of claim 1, wherein the input signal is a radio frequency (RF) signal, and the envelope tracking signal at least partially follows an envelope of the input signal.

3. The package of claim 1, further comprising:
   a supply voltage generator, for combining the DC supply voltage and the amplified envelope tracking signal to generate the envelope tracking supply voltage.

4. The package of claim 1, further comprising:
   a capacitor, coupled to an output terminal of the linear amplifier; and
   a supply voltage generator, for receiving the amplified envelope tracking signal via the capacitor, and combining the DC supply voltage and the amplified envelope tracking signal to generate the envelope tracking supply voltage.

5. The package of claim 1, wherein the linear amplifier and the power amplifier serve as part of a transmitter, and the output signal is provided to an antenna.

6. A package, comprising:
   a first linear amplifier, for receiving a first envelope tracking signal to generate an amplified first envelope tracking signal;
   a second linear amplifier, for receiving a second envelope tracking signal to generate an amplified second envelope tracking signal;
   a first power amplifier, supplied by a first envelope tracking supply voltage comprising a combination of a first DC supply voltage and the amplified first envelope tracking signal, for receiving a first input signal to generate a first output signal; and
   a second power amplifier, supplied by a second envelope tracking supply voltage comprising a combination of a second DC supply voltage and the amplified second envelope tracking signal, for receiving a second input signal to generate a second output signal,
   wherein the first linear amplifier and the first power amplifier are within one die.

7. The package of claim 6, wherein the first input signal and the second input signal are a radio frequency (RF) signals, the first envelope tracking signal at least partially follows an envelope of the first input signal, and the second envelope tracking signal at least partially follows an envelope of the second input signal.

8. The package of claim 6, wherein the first DC supply voltage and the second DC supply voltage are provided by a power management integrated circuit external to the package.

9. The package of claim 6, wherein the first DC supply voltage is different from the second DC supply voltage.

10. The package of claim 6, wherein the first envelope tracking signal is different from the second envelope tracking signal.

11. The package of claim 6, wherein the first linear amplifier, the second linear amplifier, the first power amplifier and the second power amplifier serve as part of a transmitter, and the first output signal and the second output signal are provided to at least one antenna.

12. The package of claim 6, wherein the first linear amplifier and the first power amplifier are within a first die, and the second linear amplifier and the second power amplifier are within the first die or a second die.

* * * * *